US010429441B2

(12) United States Patent
Chakraborty et al.

(10) Patent No.: US 10,429,441 B2
(45) Date of Patent: Oct. 1, 2019

(54) EFFICIENT TEST ARCHITECTURE FOR MULTI-DIE CHIPS

(71) Applicant: QUALCOMM Incorporated, San Diego, CA (US)

(72) Inventors: Tapan Jyoti Chakraborty, San Diego, CA (US); Alvin Leng Sun Loke, San Diego, CA (US); Hong Dai, San Diego, CA (US); Thomas Clark Bryan, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 113 days.

(21) Appl. No.: 15/603,779

(22) Filed: May 24, 2017

(65) Prior Publication Data

US 2018/0340977 A1    Nov. 29, 2018

(51) Int. Cl.
G01R 31/3177    (2006.01)
G01R 31/317     (2006.01)
G01R 31/3185    (2006.01)

(52) U.S. Cl.
CPC ... G01R 31/3177 (2013.01); G01R 31/31723 (2013.01); G01R 31/31727 (2013.01); G01R 31/318505 (2013.01); G01R 31/318513 (2013.01); G01R 31/318533 (2013.01); G01R 31/318536 (2013.01)

(58) Field of Classification Search
CPC .......... G01R 31/3177; G01R 31/31723; G01R 31/31727; G01R 31/318505; G01R 31/318513; G01R 31/318533; G01R 31/318536
See application file for complete search history.

(56) References Cited

U.S. PATENT DOCUMENTS

| | | | |
|---|---|---|---|
| 7,181,663 B2 | 2/2007 | Hildebrant | |
| 7,810,001 B2 | 10/2010 | Zhou et al. | |
| 8,694,276 B2 | 4/2014 | Sontakke et al. | |
| 8,829,934 B2 | 9/2014 | Sellathamby et al. | |
| 9,081,064 B2 * | 7/2015 | Whetsel | G01R 31/318541 |
| 2003/0221152 A1 | 11/2003 | Volkerink et al. | |
| 2009/0309609 A1 * | 12/2009 | De Jong | G01R 31/318555 324/537 |

(Continued)

OTHER PUBLICATIONS

International Search Report and Written Opinion—PCT/US2018/031337—ISA/EPO—dated Aug. 24, 2018.

Primary Examiner — Kyle Vallecillo
(74) Attorney, Agent, or Firm — Loza & Loza, LLP/Qualcomm

(57) ABSTRACT

Test architectures for multi-die chips are provided herein according to embodiments of the present disclosure. In certain aspects, an exemplary test architecture enables an external tester to perform various tests on a multi-die chip that includes multiple dies. In a first test mode, the test architecture enables the external tester to currently perform die-level tests on the multiple dies. In a second test mode, the test architecture enables the external tester to perform a chip-level test on the multi-die chip. The chip-level test may include die-to-die tests for testing interconnections between the multiple dies on the multi-die chip. The chip-level test may also include a boundary input/output (I/O) test for testing external connections between the multi-die chip and one or more devices external to the multi-die chip.

11 Claims, 8 Drawing Sheets

(56) References Cited

U.S. PATENT DOCUMENTS

| | | |
|---|---|---|
| 2012/0204073 A1 | 8/2012 | Whetsel |
| 2012/0280231 A1 | 11/2012 | Ito et al. |
| 2012/0324305 A1* | 12/2012 | Whetsel ......... G01R 31/318538 714/733 |
| 2013/0024737 A1 | 1/2013 | Marinissen et al. |
| 2014/0218063 A1 | 8/2014 | Roberts, Jr. |
| 2016/0003909 A1* | 1/2016 | Whetsel ........... G01R 31/31712 714/727 |
| 2017/0097389 A1* | 4/2017 | Maliuk .......... G01R 31/318541 |
| 2018/0038910 A1* | 2/2018 | Kawoosa ....... G01R 31/318385 |

* cited by examiner

EFFICIENT TEST ARCHITECTURE FOR MULTI-DIE CHIPS

RELATED APPLICATION

BACKGROUND

Field

Aspects of the present disclosure relate generally to testing, and more particularly, to test architectures for multi-die chips.

Background

A die typically includes a test circuit for testing an internal circuit (e.g., core logic) on the die and/or testing connections between the die and an external device. The test circuit may include multiple scan cells coupled in series to form a boundary scan chain on the die. The boundary scan chain provides an external tester with access to the internal circuit and input/output (I/O) pads for testing. The test circuit may also include an instruction register configured to store instructions specifying a test setup for a test.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

Test architectures for multi-die chips are provided herein according to embodiments of the present disclosure. In certain aspects, an exemplary test architecture enables an external tester to perform various tests on a multi-die chip that includes multiple dies. In a first test mode, the test architecture enables the external tester to currently perform die-level tests on the multiple dies. The die-level test for each die may include a scan test for testing a circuit (e.g., logic circuit) on the die and/or a built-in memory test for testing memory on the die. In a second test mode, the test architecture enables the external tester to perform a chip-level test on the multi-die chip. The chip-level test may include die-to-die tests for testing interconnections between the multiple dies on the multi-die chip. The chip-level test may also include a boundary input/output (I/O) test for testing external connections between the multi-die chip and one or more devices external to the multi-die chip.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
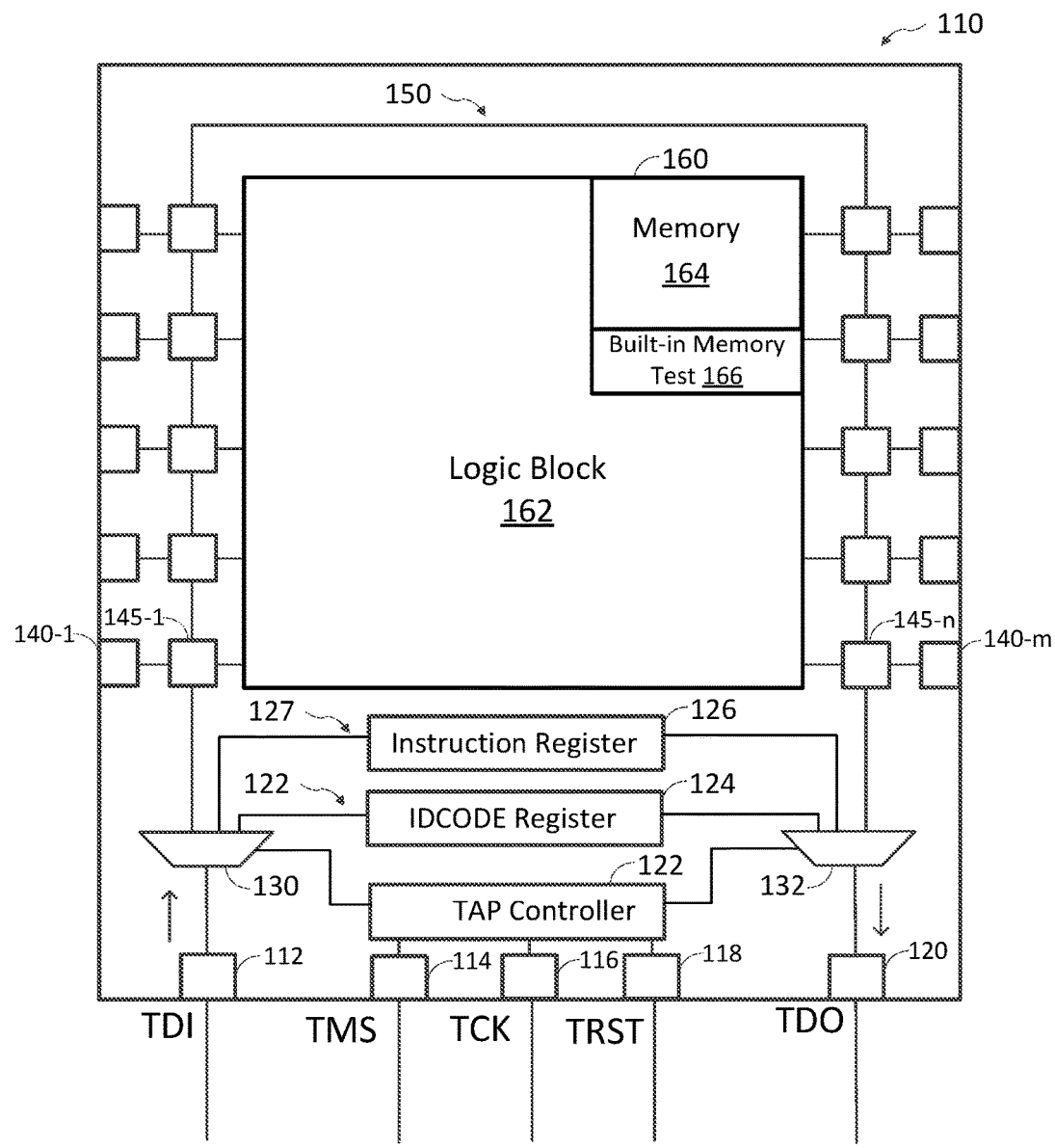
FIG. 1 shows an example of a test circuit for a die according to certain aspects of the present disclosure.

A die typically includes a test circuit for testing a circuit (e.g., core logic) on the die and/or testing connections between the die and an external device. In this regard, FIG. 1 shows an example of a die 110 including a test circuit that supports a Joint Test Action Group (JTAG) standard. The test circuit includes multiple scan cells 145-1 to 145-n coupled in series to form a boundary scan chain 150 (also referred to as a boundary scan path). Each of the scan cells 145-1 to 145-n may be coupled to a respective I/O pad 140-1 to 140-m on the die 110 and/or a circuit 160 on the die 110. As discussed further below, the boundary scan chain 150 provides an external tester (not shown) with access to the I/O pads 140-1 to 140-m and the circuit 160 for testing.

Each scan cell 145-1 to 145-n may be programmed to propagate test data down the boundary scan chain 150. The scan cell may do this, for example, by shifting data received from a preceding scan cell in the scan chain 150 to a next scan cell in the scan chain 150. Each scan cell 145-1 to 145-n may also be programmed to input test data to the respective I/O pad and/or the circuit 160 to provide test stimulus to the respective I/O pad and/or the circuit 160. Each scan cell 145-1 to 145-n may also be programmed to capture test data from the respective I/O pad and/or the circuit 160. The scan cell may shift the captured data to the next scan cell in the scan chain 150 so that the captured data can propagate down the scan chain 150 and be read out of the die 110. A scan cell may be coupled to the respective I/O pad via a transmitter (not shown) to enable the scan cell to drive the I/O pad, and/or a receiver (not shown) to enable the scan cell to receive a signal from the I/O pad. A scan cell may include multiplexers and latches configured to perform the functions discussed above. In the functional mode, signals may pass between the I/O pads and the circuit 160 through the scan cells or around the scan cells, in which case the scan cells are transparent.

The test circuit also includes a test access port (TAP) controller 122, an instruction register 126, an identification code register 124 (labeled "IDCODE Register" in FIG. 1), a demultiplexer 130, and a multiplexer 132. As discussed further below, the instruction register 126 is configured to store instructions specifying a test setup, and the identification code register 124 is configured to store an identification code identifying the die 110. The demultiplexer 130 is configured to selectively couple a test data input (TDI) 112 of the die 110 to the scan chain 150, the instruction register 126, or the identification code register 124. The multiplexer 132 is configured to selectively couple the scan chain 150, the instruction register 126, or the identification code register 124 to a test data output (TDO) 120 of the die 110. The TAP controller 122 is configured to control operations of the test circuit based on test mode select (TMS) signals received at a TMS input 114 of the die 110, as discussed further below.

For test setup, the TAP controller 122 instructs the demultiplexer 130 to couple the TDI 112 to the instruction register 126, and instructs the multiplexer 132 to couple the instruction register 126 to the TDO 120. The TAP controller 122 may then serially load test instructions (also referred to as an instruction vector) from the external tester (not shown) into the instruction register 126 via the TDI 112. Programming logic (not shown) on the die 110 reads the instructions in the instruction register 126 and programs the scan cells 145-1 to 145-n and/or other test logic (e.g., internal scan paths) on the die 110 to setup the test specified in the instructions.

For test execution, the TAP controller 122 may instruct the demultiplexer 130 to couple the TDI 112 to the boundary scan chain 150, and instruct the multiplexer 132 to couple the boundary scan chain 150 to the TDO 120. The TAP controller 122 may then serially load (scan) test data from the external tester into the boundary scan chain 150 via the TDI 112. The test data may be shifted from scan cell to scan cell in the boundary scan chain 150 to propagate the test data down the boundary scan chain 150.

Depending on the test setup, the test circuit may perform any one of multiple tests during test execution. For example, the test circuit may perform a scan test in which one or more scan cells may input test data into a logic block 162 in the circuit 160 to test the logic block 162. The test data may propagate through one or more scan paths (e.g., sequential logic) in the logic block. The logic block 162 may then output the test data to one or more scan cells in the scan chain 150, which capture the test data. The captured test data may propagate down the scan chain 150 to the TDO 120 for output to the external tester. The external tester may compare the output test data from the TDO 120 with expected test data to determine whether the logic block 162 is functioning properly. Thus, the scan chain 150 may be used to test internal circuit structures on the die 110.

Alternatively, the external tester may perform a scan test by inputting test data to the logic block 162 via one or more of the I/O pads 140-1 to 140-m. In this example, the test data may propagate through one or more scan paths in the logic block 162. The logic block 162 may then output the test data to one or more of the I/O pads, in which the external tester receives the test data via the one or more of the I/O pads. In this example, the external tester is coupled to one or more of the I/O pads of the die 110 to input and receive test data for the scan test. The scan paths for the scan test may be setup by the TAP controller 122, as discussed above, in which instructions loaded into the instruction register 126 specify the scan paths. In this example, the external tester does not need to use the boundary scan chain 150 to scan in and/or scan out the test data, in which case the test data may pass through or around the scan cells.

In another example, the test circuit may perform a boundary I/O test to test connections between the die 110 and one or more external devices. For this test, one or more scan cells may drive the respective I/O pads with test data using the respective transmitter (driver). The driving may generate test data at one or more I/O pads, which may be captured by one or more scan cells. The generated test data may indicate a connection fault. For example, if one I/O pad is driven with a certain value, and the value is observed at another I/O pad, then the generated test data indicates that the connections for these I/O pads are shorted together. In another example, an external device may transmit test data including a sequence of known values across one or more connections between the external device and the die 110. In this example, one or more scan cells may capture test data received at one or more I/O pads from the external device. Since the test data transmitted by the external device is known, the external tester may compare the known transmitted test data with the received test data to detect faults in the connections between the external device and the die 110. The captured test data may propagate down the boundary scan chain 150 to the TDO 120 for output to the external tester. The external tester may compare the output test data from the TDO 120 with expected test data to determine whether there is a fault in one or more of the connections such as an open circuit, a short circuit, a stuck-at-one fault, etc.

In another example, the test circuit may perform a built-in memory test to test the functionality of memory on the die 110. In this example, the die 110 includes an embedded memory 164, and a built-in memory test circuit 166. The memory test circuit 166 is configured to test the memory 164 and generate test data based on the memory test indicating whether the memory is functioning properly. The memory test may involve writing a test pattern into the memory 164, reading back the test pattern from the memory 164, and determining whether there is an error in the read test pattern. The test data generated by the memory test circuit 166 may be output to one or more scan cells, and shifted out of the scan chain 150 to the external tester.

It is to be appreciated that the present disclosure is not limited to the above examples, and that the test circuit may perform other tests instead of or in addition to the exemplary tests discussed above.

Therefore, the test circuit provides an external tester with a test interface for testing internal circuit structures on the die 110 and/or connections between the die 110 and an external device.

The TAP controller 122 is typically implemented with a state machine including states for performing the operations discussed above. The external tester typically inputs TMS signals to the TAP controller 122 via the TMS input 114 to cause the TAP controller 122 to transition between the states to perform the operations discussed above. The external tester may reset the state machine of the TAP controller 122 by inputting a reset signal to a reset input 118 (labeled "TRST" in FIG. 1) of the die 110.

In order to read the identification code of the die 110 in the identification code register 124 to identify the die 110, the external tester may input an instruction to the instruction register 126 to read the identification code. This instruction may be referred to as an IDCODE instruction. Programming logic (not shown) on the die 110 reads the IDCODE instruction and programs the demultiplexer 130 and the multiplexer 132 to couple the TDI 112 and the TDO 120 to the identification code register 124, allowing the identification code to be read by the external tester. The identification code may include a manufacturer identification (ID), a part number, and/or a version number.

The external tester may input a clock signal to the TAP controller 122 via a clock input 116 (labeled "TCK" in FIG. 1) to time operations of the TAP controller 122. The clock signal may also be used to clock the scan cells 145-1 to 145-n and the registers 124 and 126. For example, the clock signal may be used to time the shifting of test data in the scan paths.

The test methodology discussed above may be used for testing a single die. Today, multiple dies may be packaged together on a single substrate (e.g., a ceramic substrate or another type of substrate) to form a multi-die chip (also referred to as a multi-chip module (MCM)). Multi-die chips present a challenge to existing test methodologies developed primarily for single die testing. It is desirable to develop a test architecture capable of performing various tests on the dies on a multi-die chip within a relatively short test time to reduce test costs.

Figure 2:
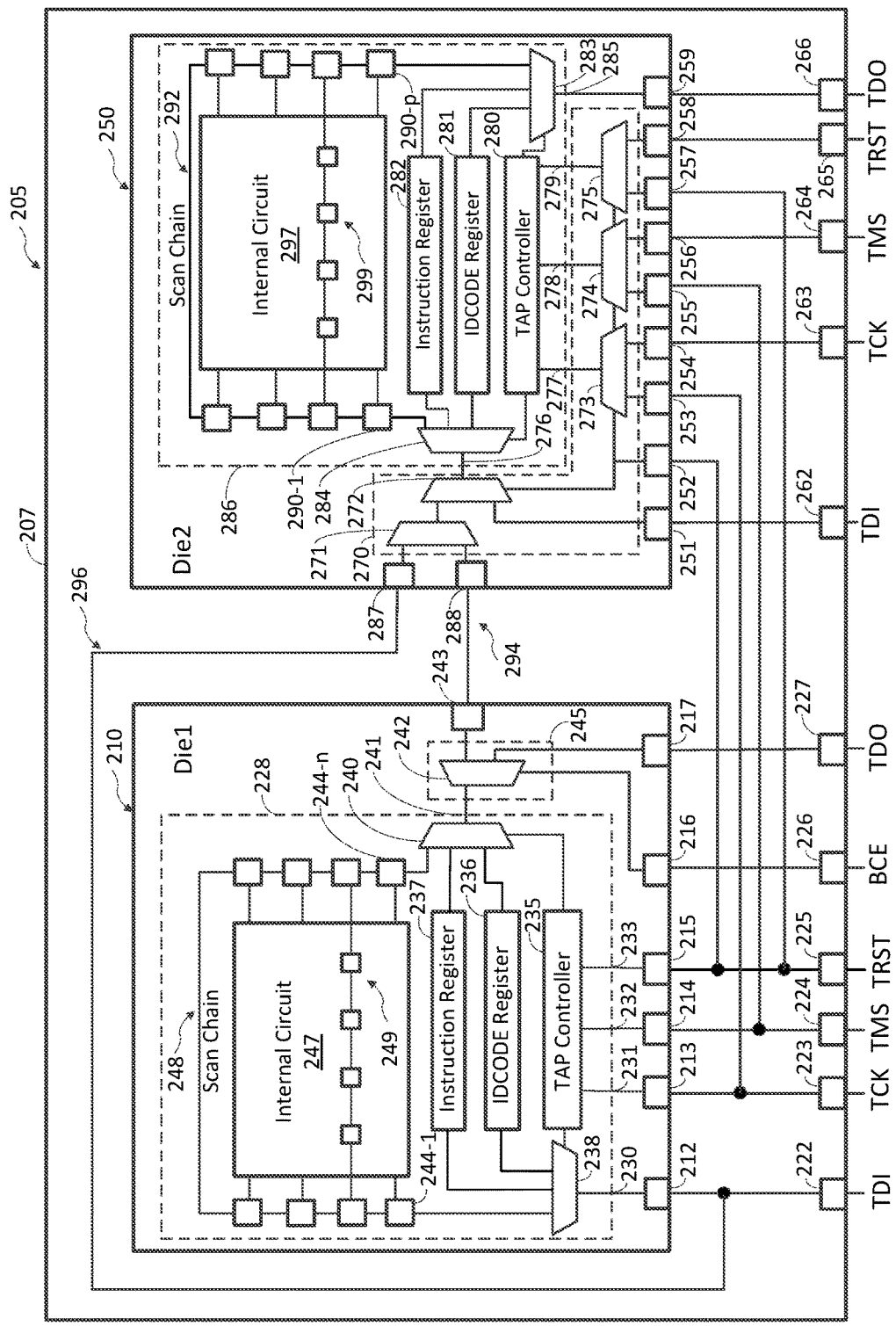
FIG. 2 shows an example of a reconfigurable test circuit for a multi-die chip according to certain aspects of the present disclosure.

FIG. 2 shows a reconfigurable test circuit for a multi-die chip 205 (also referred to as a multi-chip module (MCM)) according to certain aspects of the present disclosure. In the example shown in FIG. 2, the multi-die chip 205 includes a first die 210 (labeled "Die1") and a second die 250 (labeled "Die2") packaged together on a substrate 207 (e.g., a ceramic substrate or another type of substrate). Although two dies are shown in FIG. 2 for simplicity, it is to be appreciated that the multi-die chip 205 may include more than two dies.

In this example, the first die 210 includes a test data input (TDI) 212, a test clock (TCK) input 213, a test mode select (TMS) input 214, a test reset (TRST) input 215, a BCE input 216, a first test data output (TDO) 217, and a second TDO 243. The second die 250 includes a first TDI 251, a second TDI 287, a third TDI 288, a BCE input 252, a first TCK input 253, a second TCK input 254, a first TMS input 255, a second TMS input 256, a first TRST input 257, a second TRST input 258, and a TDO 259. The second TDO 243 of the first die 210 is coupled to the third TDI 288 of the second die 250 via path 294, as shown in FIG. 2. The path 294 may include a conductive trace on the substrate 207. Each of the above inputs may be referred to as a die-level input for inputting signals (e.g., test data, TMS signal, etc.) to the respective die, and each of the above outputs may be referred to as a die-level output for outputting signals (e.g., test data) from the respective die. The BCE inputs 216 and 252 are new control inputs for receiving a new control signal that controls the configuration of the reconfigurable test circuit of the multi-die chip 205, as discussed further below.

The multi-die chip 205 includes a first TDI 222, a second TDI 262, a first TCK input 223, a second TCK input 263, a first TMS input 224, a second TMS input 264, a first TRST input 225, a second TRST input 265, a BCE input 226, a first TDO 227, and a second TDO 266. The above inputs may be referred to as external inputs of the multi-die chip 205 since they are used by an external tester for inputting test signals (e.g., test data, TMS signals, test clock signals, etc.) to the multi-die chip 205. The above outputs may be referred to as external outputs of the multi-die chip 205 since they are used for outputting test signals (e.g., test data) from the multi-die chip 205 to the external tester.

In the example shown in FIG. 2, TDI 222 is coupled to the TDI 212 of the first die 210. TDI 222 is also coupled to the second TDI 287 of the second die 250 via a bypass path 296, as discussed further below. The bypass path 296 may include a conductive trace on the substrate 207. TCK input 223 is coupled to the TCK input 213 of the first die 210 and the first TCK 253 of the second die 250. TMS input 224 is coupled to the TMS input 214 of the first die 210 and the first TMS input 255 of the second die 250. TRST input 225 is coupled to the TRST input 215 of the first die 210 and the first TRST 257 of the second die 250. BCE input 226 is coupled to the BCE input 216 of the first die 210, and the BCE input 252 of the second die 250. TDO 227 is coupled to the first TDO 217 of the first die 210.

TDI 262 is coupled to the first TDI 251 of the second die 250. TCK input 263 is coupled to the second TCK input 254 of the second die 250. TMS input 264 is coupled to the second TMS input 256 of the second die 250. TRST input 265 is coupled to the second TRST 258 of the second die 250. TDO 266 is coupled to the TDO 259 of the second die 250. In this example, the inputs and outputs of the multi-die chip may be coupled to the respective die-level inputs and outputs via conductive traces on the substrate 207.

The first die 210 includes a first test circuit 228. The first test circuit 228 includes multiple scan cells 244-1 to 244-n coupled in series to form a boundary scan chain 248. The boundary scan chain 248 may be used for testing an internal circuit of the first die 210, testing interconnections between the first die 210 and the second die 250, and/or testing connections between the first die 210 and a device external to the multi-die chip 205, as discussed further below.

The first test circuit 228 also includes a test access port (TAP) controller 235, an instruction register 237, an identification code register 236 (labeled "IDCODE Register"), a demultiplexer 238, and a multiplexer 240. The instruction register 237 is configured to store instructions specifying a test setup, and the identification code register 236 is configured to store an identification code identifying the first die 210. The first test circuit 228 has a TDI 230, a TCK input 231, a TMS input 232, a TRST input 233, and a TDO 241. In this example, the TDI 230 of the first test circuit 228 is coupled to TDI 212, the TCK input 231 of the first test circuit 228 is coupled to TCK input 213, the TMS input 232 of the first test circuit 228 is coupled to TMS input 214, and the TRST input 233 of the first test circuit 228 is coupled to TRST input 215.

The demultiplexer 238 is configured to selectively couple the TDI 230 of the first test circuit 228 to the scan chain 248, the instruction register 237, or the identification code register 236. The multiplexer 240 is configured to selectively couple the scan chain 248, the instruction register 237, or the identification code register 236 to the TDO 241 of the first test circuit 228.

The first die 210 also includes a first test configuration circuit 245 including a demultiplexer 242. The demultiplexer 242 is configured to selectively couple the TDO 241 of the first test circuit 228 to the first TDO 217 or the second TDO 243 of the first die 210 based on the control signal received at the BCE input 216, as discussed further below.

The second die 250 includes a second test circuit 286. The second test circuit 286 includes multiple scan cells 290-1 to 290-p coupled in series to form a boundary scan chain 292. The boundary scan chain 292 may be used for testing an internal circuit of the second die 250, testing interconnections between the second die 250 and the first die 210, and/or testing connections between the second die 250 and a device external to the multi-die chip 205, as discussed further below.

The second test circuit 286 also includes a test access port (TAP) controller 280, an instruction register 282, an identification code register 281 (labeled "IDCODE Register"), a demultiplexer 284, and a multiplexer 283. The instruction register 282 is configured to store instructions specifying a test setup, and the identification code register 281 is configured to store an identification code identifying the second die 250. The second test circuit 286 has a TDI 276, a TCK input 277, a TMS input 278, a TRST input 279, and a TDO 285.

The demultiplexer 284 is configured to selectively couple the TDI 276 of the second test circuit 286 to the scan chain 292, the instruction register 282, or the identification code register 281. The multiplexer 283 is configured to selectively couple the scan chain 292, the instruction register 282, or the identification code register 281 to the TDO 285 of the second test circuit 286. In the example in FIG. 2, the TDO 285 of the second test circuit 286 is coupled to the TDO 259 of the second die 250.

The second die 250 also includes a second test configuration circuit 270. The second test configuration circuit 270 includes a first multiplexer 271, a second multiplexer 272, a third multiplexer 273, a fourth multiplexer 274, and a fifth multiplexer 275. The first multiplexer 271 is configured to selectively couple the second TDI 287 or the third TDI 288 to the second multiplexer 272 based on a IDCODE instruction, as discussed further below. The second multiplexer 272 is configured to selectively couple the output of the first multiplexer 271 or the first TDI 251 to the TDI 276 of the second test circuit 286 based on a control signal received at the BCE input 252. The third multiplexer 273 is configured to selectively couple the first TCK input 253 or the second TCK input 254 to the TCK input 277 of the second test circuit 286 based on the control signal received at the BCE input 252. The fourth multiplexer 274 is configured to selectively couple the first TMS input 255 or the second TMS input 256 to the TMS input 278 of the second test circuit 286 based on the control signal received at the BCE input 252. Finally, the fifth multiplexer 275 is configured to selectively couple the first TRST input 257 or the second TRST input 258 to the TRST input 279 of the second test circuit 286 based on the control signal received at the BCE input 252.

Figure 3:
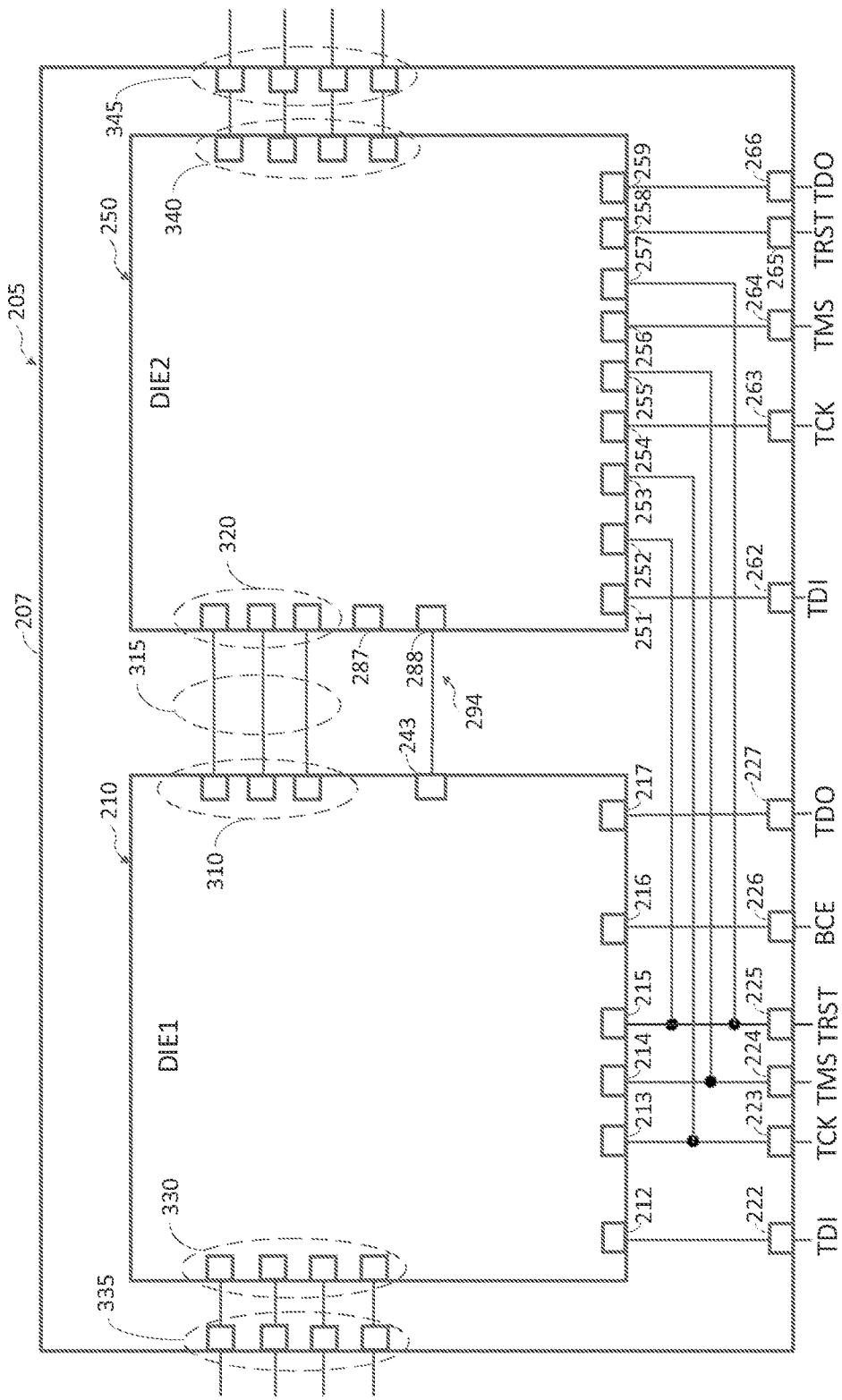
FIG. 3 shows an example of interconnections between dies on the multi-die chip and external connections between the multi-die chip and one or more external devices according to certain aspects of the present disclosure.

Referring to FIG. 3, the first die 210 may also include a first set of I/O pads 310 and the second die 250 may include a first set of I/O pads 320. For ease of illustration, the internal test circuits of the first die 210 and second die 250 are not shown in FIG. 3. The first set of I/O pads 310 of the first die 210 may be coupled to one or more of the scan cells 244-1 to 244-n (shown in FIG. 2) of the first die 210, and the first set of I/O pads 320 of the second die 250 may be coupled to one or more of the scan cells 290-1 to 290-p (shown in FIG. 2) of the second die 250. The first set of I/O pads 310 of the first die 210 is coupled to the first set of I/O pads 320 of the second die 250 via respective connections 315. The connections 315 (also referred to as channels) may include conductive traces on the substrate 207 of the multi-die chip 205. The connections allow the first die 210 and the second die 250 to communicate with one another. As discussed further below, the test circuit for the multi-die chip 205 supports testing of the connections 315 between the first die 210 and the second die 250.

The first die 210 may also include a second set of I/O pads 330 coupled to a first set of I/O contacts 335 of the multi-die chip 205. The first set of I/O contacts 335 may be coupled to one or more devices that are external to the multi-die chip 205 to allow the first die 210 to communicate with the one or more external devices. The second die 250 may also include a second set of I/O pads 340 coupled to a second set of I/O contacts 345 of the multi-die chip 205. The second set of I/O contacts 345 may be coupled to one or more devices that are external to the multi-die chip 205 to allow the second die 250 to communicate with the one or more external devices. It is to be understood that the I/O pads and I/O contacts are shown in a separate figure (i.e., FIG. 3) to avoid cluttering FIG. 2.

Referring back to FIG. 2, the first and second test configuration circuits 245 and 270 of the reconfigurable test circuit enable the multi-die chip 205 to be tested in any one of multiple test configurations based on the control signal input to the BCE input 226. Various test configurations supported by embodiments of the present disclosure are discussed further below.

In a first test configuration, the first die 210 and the second die 250 may be tested concurrently. An external tester may enable the first test configuration by inputting a corresponding control signal to the BCE input 226. For example, the first test configuration may be enabled when a first logic value (e.g., logic zero) is input to the BCE input 226.

In response to the control signal for the first test configuration, the demultiplexer 242 of first test configuration circuit 245 couples the TDO 241 of the first test circuit 228 to the first TDO 217 of the first die 210. As discussed further below, this configuration allows the external tester to perform a die-level test on the first die 210 using the first test circuit 228. The external tester accesses the first test circuit 228 for a die-level test of the first die 210 via TDI 222, TCK input 223, TMS input 224, TRST input 225 and TDO 227.

In response to the control signal for the first test configuration, the second multiplexer 272 of the second test configuration circuit 270 couples the first TDI 251 of the second die 250 to the TDI 276 of the second test circuit 286. In addition, the third multiplexer 273 of the second test configuration circuit 270 couples the second TCK input 254 to the TCK input 277 of the second test circuit 286. The fourth multiplexer 274 of the second test configuration circuit 270 couples the second TMS input 256 of the second die 250 to the TMS input 278 of the second test circuit 286. The fifth multiplexer 275 of the second test configuration circuit 270 couples the second TRST input 258 of the second die 250 to the TRST input 279 of the second test circuit 286. As discussed further below, this configuration allows the external tester to perform a die-level test on the second die 250 using the second test circuit 286. The external tester accesses the second test circuit 286 for a die-level test of the second die 250 via TDI 262, TCK input 263, TMS input 264, TRST input 265 and TDO 266.

The first test configuration allows the external tester to concurrently test the first die 210 and the second die 250, which significantly reduces test time compared with sequentially testing of the first die 210 and the second die 250. For example, testing the first die 210 and second die 220 concurrently instead of sequentially may reduce total test time for the dies by approximately half for similar sized dies. As discussed further below, the test architecture shown in FIG. 2 can be scaled up to provide testing for multi-die chips including three or more dies. In these cases, concurrent die testing provides even greater reduction in total test time.

As discussed above, the first test configuration allows the external tester to test the first die 210 using the first test circuit 228 on the first die 210. The external tester accesses the first test circuit 228 via TDI 222, TCK input 223, TMS input 224, TRST input 225 and TDO 227.

For test setup, the TAP controller 235 may instruct the demultiplexer 238 to couple the TDI 230 of the first test circuit 228 to the instruction register 237, and instruct the multiplexer 240 to couple the instruction register 237 to the TDO 241 of the first test circuit 228. Note that, in the first test configuration, the first test configuration circuit 245 couples the TDO 241 of the first test circuit 228 to the first TDO 217 of the first die 210. The external tester may then load test instructions (also referred to as an instruction vector) into the instruction register 237 via TDI 222. Programming logic (not shown) on the first die 210 may program the scan cells 244-1 to 244-n and/or other test logic (e.g., internal scan paths) on the first die 210 to setup the test specified by the instructions in the instruction register 237.

For test execution, the TAP controller 235 may instruct the demultiplexer 238 to couple the TDI 230 of the first test circuit 228 to the scan chain 248, and instruct the multiplexer 2240 to couple the scan chain 248 to the TDO 241 of the first test circuit 228. Note that, in the first test configuration, the first test configuration circuit 245 couples the TDO 241 of the first test circuit 228 to the first TDO 217 of the first die 210. The external tester may then load (scan) test data into the scan chain 248 via TDI 222.

Depending on the test setup, the first test circuit 228 may perform any one or more of the exemplary tests discusses above including a scan test to test an internal circuit 247 on the first die 210, a built-in memory test to test memory on the first die 210, etc. The circuit 247 may include a logic block (not shown) and memory (not shown), examples of which are shown in FIG. 1. The circuit 247 may be coupled to the scan cells (as shown in FIG. 2) and coupled to the I/O pads 310 and 330 shown in FIG. 3. The test data resulting from the one or more tests may be captured by one or more scan cells, and shifted out of the scan chain 248 to the external tester via TDO 227.

For the scan test, the external tester may input test data to the first die 210 and receive test data from the first die 210 via one or more of the I/O pads 330 (shown in FIG. 3) instead of using the scan chain 248. In this case, the external tester may be coupled to the one or more of the I/O pads 330 via I/O contacts 335 and use internal scan paths to test the circuit 247 on the die 210, as discussed above. The internal scan paths for the scan test may be setup by the TAP controller 235, as discussed above, in which the internal scan paths are specified by instructions loaded into the instruction register 237. FIG. 2 shows an example of an internal scan path 249 including sequential logic for shifting test data through the internal circuit 247. Although one scan path 249 is depicted in FIG. 2 for ease of illustration, it is to be appreciated that the first die may include many internal scan paths for testing. Also, although FIG. 2 shows an example in which the scan path 249 is coupled to scan cells of the scan chain, it is to be appreciated that this need not be the case. For example, the scan path 249 may be coupled between I/O pads (shown in FIG. 3) on the die, in which case, the external tester may input test data to and receive test data from the scan path 249 via the I/O pads.

The external tester may also read the identification code of the first die 210 by inputting an IDCODE instruction to the first die 210. In response to the IDCODE instruction, the programming logic on the first die 210 couples the identification code register 236 to the TDI 230 and TDO 241 of the first test circuit 228 using the demultiplexer 238 and the multiplexer 240. This allows the external tester to read the identification code of the first die 210 via TDO 227.

The external tester may input a clock signal to the first test circuit 228 via TCK input 223 to time operations of the first test circuit 228 (e.g., clock the scan cells and registers in the first test circuit 228). The external tester may also input a rest signal to TRST input 225 to reset the TAP controller 235.

Thus, the first test configuration allows the external tester to perform a die-level test on the first die 210 using the first test circuit 228. The structure of the first test circuit 228 may be similar to the structure of the test circuit shown in FIG. 1, allowing the external tester to perform any one of the tests discussed above in connection with FIG. 1 on the first die 210.

The first test configuration also allows the external tester to perform a die-level test on the second die 250 using the second test circuit 286 on the second die 250. In this configuration, the external tester accesses the second test circuit 286 via TDI 262, TCK input 263, TMS input 264, TRST input 265 and TDO 266.

For test setup, the TAP controller 280 may instruct the demultiplexer 284 to couple the TDI 276 of the second test circuit 286 to the instruction register 282, and instruct the multiplexer 283 to couple the instruction register 282 to the TDO 285 of the second test circuit 286. Note that the first TDI 251 of the second die 250 is coupled to the TDI 276 of the second test circuit 286 by the second test configuration circuit 270 in this configuration. The external tester may then load test instructions (also referred to as an instruction vector) into the instruction register 282 via TDI 262. Programming logic (not shown) on the second die 250 may program the scan cells 290-1 to 290-p and/or other test logic (e.g., internal scan path) on the second die 250 to set up the test specified by the instructions in the instruction register 282.

For test execution, the TAP controller 270 may instruct the demultiplexer 284 to couple the TDI 276 of the second test circuit 286 to the scan chain 292, and instruct the multiplexer 283 to couple the scan chain 292 to the TDO 285 of the second test circuit 255. The external tester may then load (scan) test data into the scan chain 292 via TDI 262.

Depending on the test setup, the second test circuit 282 may perform any one or more of the exemplary tests discusses above including a scan test to test an internal circuit 297 on the second die 250, a built-in memory test to test memory on the second die 250, etc. The circuit 297 may include a logic block (not shown) and memory (not shown), examples of which are shown in FIG. 1. The circuit 297 may be coupled to the scan cells (as shown in FIG. 2) and coupled to the I/O pads 320 and 340 shown in FIG. 3. The test data resulting from the one or more tests may be captured by one or more scan cells, and shifted out of the scan chain 292 to the external tester via TDO 266.

For the scan test, the external tester may input test data to the second die 250 and receive test data from the second die 250 via one or more of the I/O pads 340 (shown in FIG. 3) instead of using the scan chain 292. In this case, the external tester may be coupled to the one or more of the I/O pads 340 via external I/O contacts 345 and use internal scan paths to test internal logic on the die 250, as discussed above. The internal scan paths for the scan test may be setup by the TAP controller 280, as discussed above, in which the internal scan paths are specified by instructions loaded into the instruction register 282. FIG. 2 shows an example of an internal scan path 299 including sequential logic for shifting test data through the internal circuit 297. Although one scan path 299 is depicted in FIG. 2 for ease of illustration, it is to be appreciated that the second die may include many internal scan paths for testing. Also, although FIG. 2 shows an example in which the scan path 299 is coupled to scan cells of the scan chain, it is to be appreciated that this need not be the case. For example, the scan path 299 may be coupled between I/O pads (shown in FIG. 3) on the die, in which case, the external tester may input test data to and receive test data from the scan path 249 via the I/O pads.

The external tester may also read the identification code of the second die 250 by inputting an IDCODE instruction to the second die 250. In response to the IDCODE instruction, the programming logic on the second die 250 couples the identification code register 281 to the TDI 276 and TDO 285 of the second test circuit 286 using the demultiplexer 284 and the multiplexer 283. This allows the external tester to read the identification code of the second die 250 via TDO 266.

The external tester may input a clock signal to the second test circuit 286 via TCK input 263 to time operations of the second test circuit 286 (e.g., clock the scan cells and registers in the second test circuit 286). The external tester may also input a rest signal to TRST input 265 to reset the TAP controller 280.

Thus, the first test configuration allows the external tester to perform a die-level test on the second die 250 using the second test circuit 286. The structure of the second test circuit 286 may be similar to the structure of the test circuit shown in FIG. 1, allowing the external tester to perform any one of the tests discussed above in connection with FIG. 1 on the second die 250.

Figure 4A:
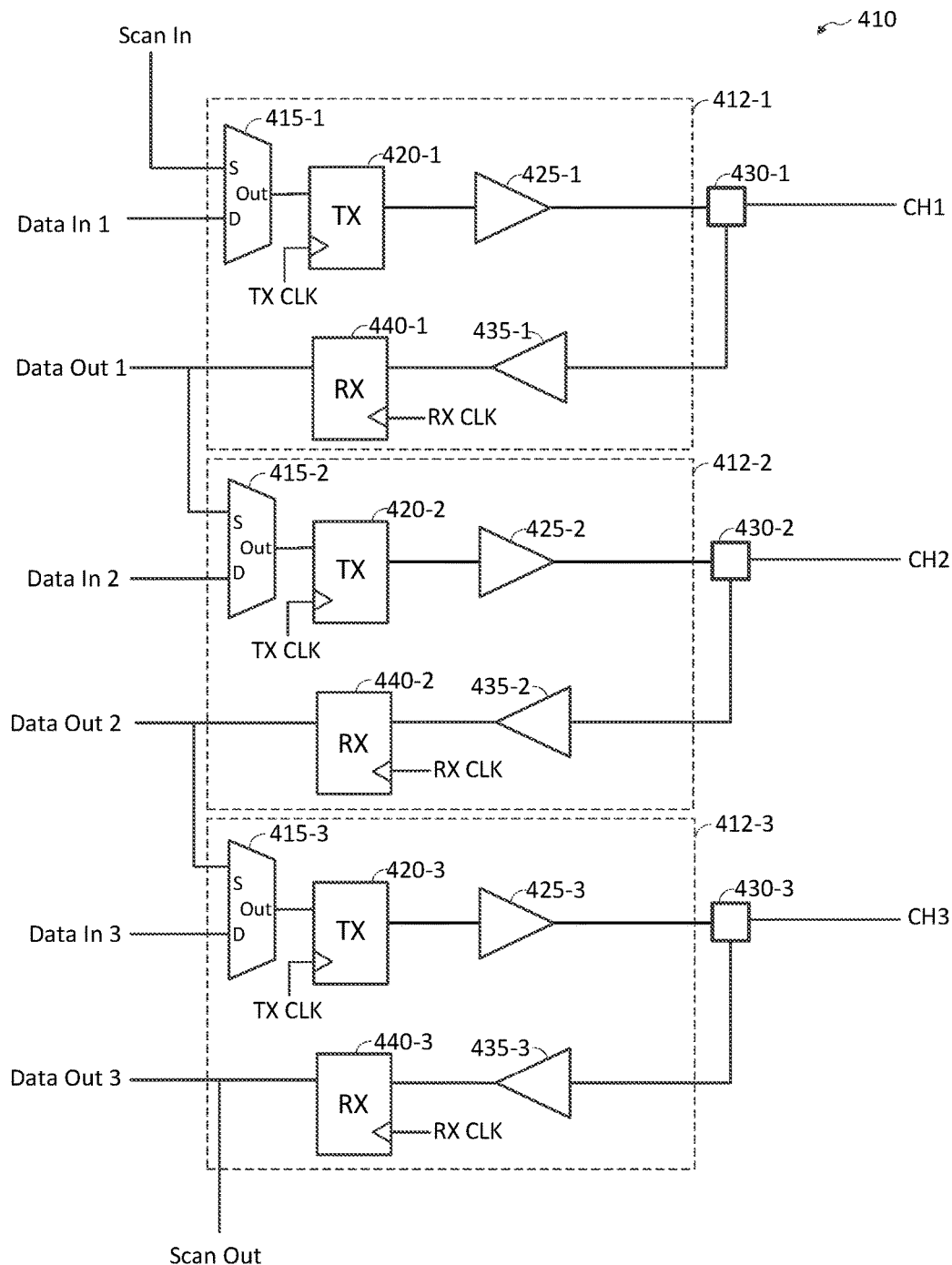
FIG. 4A shows an example of a test structure for performing a loop-back test according to certain aspects of the present disclosure.

In the first test configuration, the testing performed by the external tester on each of the first and second dies 210 and 250 may include a loop-back test to test the functionality of transmitters and receivers on each of the first and second dies 210 and 250. In this regard, FIG. 4A shows an example of a circuit 410 that supports loop-back testing, according to certain aspects. The circuit 410 is described below in the context of the first die 210 for ease of discussion. However, it is to be appreciated that the circuit 410 is also applicable to the second die 250.

In this example, the circuit 410 includes multiple transceivers 412-1 to 412-3, in which each transceiver is coupled to a respective I/O pad 430-1 to 430-3 of the first die 210. Each of these I/O pads 430-1 to 430-3 may be coupled to a respective channel (labeled CH1 to CH3). In one example, the channels CH1 to CH3 may be coupled between the first die 210 and the second die 250 to support communication between the first die 210 and the second die 250. In this example, the I/O pads 430-1 to 430-3 may correspond to the I/O pads 310 in FIG. 3. The channels CH1 to CH3 may include conductive traces on the substrate 207 of the multi-die chip 205. In another example, the channels CH1 to CH3 may be coupled between the first die 210 and a device external to the multi-die chip 205 to support communication between the first die 210 and the device. In this example, the I/O pads 430-1 to 430-3 may correspond to the I/O pads 330 in FIG. 3.

Each of the transceivers 412-1 to 412-3 includes a respective transmit latch 420-1 to 420-3, a respective transmitter 425-1 to 425-3, a respective receiver 435-1 to 435-3, and a respective receive latch 440-1 to 440-3. The respective transmit latch 420-1 to 420-3 is clocked by a transmit clock signal ("TX CLK"). The respective transmitter 425-1 to 425-3 is coupled between the output of the respective transmit latch 420-1 to 420-3 and the respective I/O pad 430-1 to 430-3. The respective receive latch 440-1 to 440-3 is clocked by a receive clock signal ("RX CLK"). The respective receiver 435-1 to 435-3 is coupled between the respective I/O pad 430-1 to 430-3 and the input of the respective receive latch 440-1 to 440-3.

The circuit 410 also includes multiple scan multiplexers 415-1 to 415-3. The first scan multiplexer 415-1 has a first input (labeled "S") coupled to a scan input ("Scan In"), a second input (labeled "D") coupled to a first data input ("Data In 1"), and an output coupled to the input of the first transmit latch 420-1. The second scan multiplexer 415-2 has a first input (labeled "S") coupled to the output of the first receive latch 440-1, a second input (labeled "D") coupled to a second data input ("Data In 2"), and an output coupled to the input of the second transmit latch 420-2. The third scan multiplexer 415-3 has a first input (labeled "S") coupled to the output of the second receive latch 440-2, a second input (labeled "D") coupled to a third data input ("Data In 3"), and an output coupled to the input of the third transmit latch 420-3. A scan output ("Scan Out") is taken at the output of the third receive latch 440-3.

The circuit 410 is configured to operate in a functional mode or a test mode. In the functional mode, each scan multiplexer 415-1 to 415-3 couples the respective data input to the input of the respective transmit latch 420-1 to 420-3. In this mode, each transceiver 412-1 to 412-3 is configured to transmit the respective input data over the respective channel and/or receive respective data from the respective channel. In each transceiver, the input data to be transmitted over the respective channel is sampled at the respective transmit latch using the transmit clock signal TX CLK and transmitted across the respective channels by the respective transmitter, and data received from the respective channel by the respective receiver is sampled at the respective receive latch using the receive clock signal RX CLK.

Figure 4B:
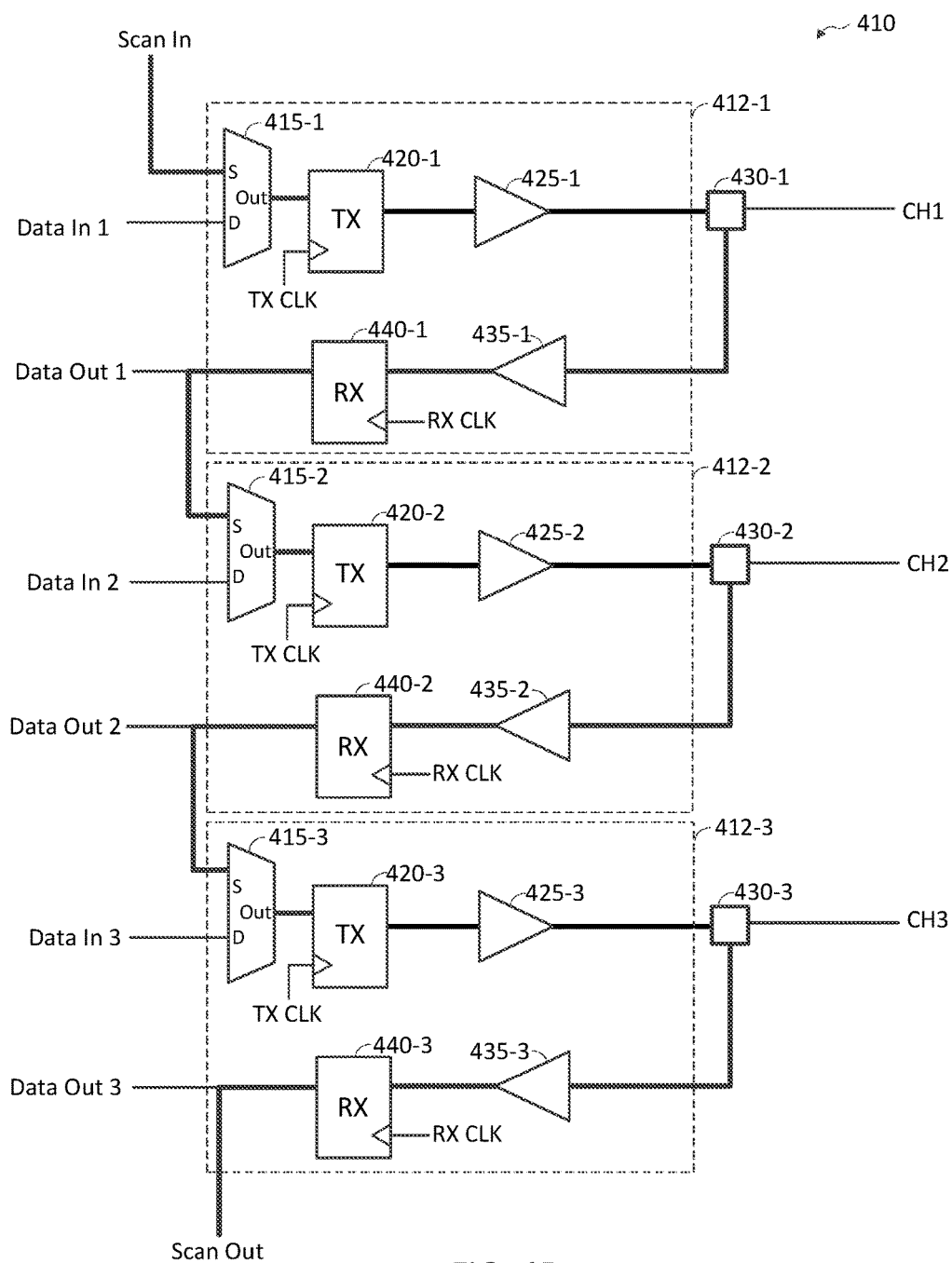
FIG. 4B shows the test structure of FIG. 4A, in which the signal path for the loop-back test is highlighted according to certain aspects of the present disclosure.

In the test mode, the first scan multiplexer 415-1 couples the scan input ("Scan In") to the input of the first transmit latch 420-1. The second scan multiplexer 415-2 couples the output of the first receive latch 440-1 to the input of the second transmit latch 420-2. The third scan multiplexer 415-3 couples the output of the second receive latch 440-2 to the input of the third transmit latch 420-3. This configuration forms a scan path from the scan input ("Scan In") to the scan output ("Scan Out") that passes through each of the transmitters 425-1 to 425-3 and each of the receivers 435-1 and 435-3, and can therefore be used to test the functionality of the transmitters and receivers. FIG. 4B shows the scan path with thickened lines to highlight the scan path.

In certain aspects, the external tester may include the loop-back test during testing of the first die 210. In this regard, the external tester may load instructions for the loop-back test into the instruction register 237. Programming logic on the first die 210 may then program the scan multiplexers 415-1 to 415-3 to form the scan path, as discussed above. During test execution, one of the scan cells on the first die 210 may input test data into the scan path via the scan input ("Scan In"). The test data passes through the transmitters 425-1 to 425-3 and receivers 435-1 to 435-3 as the test data propagates down the scan path. Another one of the scan cells on the first die 210 may receive the test data at the scan output ("Scan Out"). The test data may then propagate down the scan chain 248 for output to the external tester. The external tester may compare the output test data with expected test data to determine whether the transceivers 412-1 to 412-3 are functioning properly.

Alternatively, a first scan test circuit (not shown) may generate a test pattern, and input the test pattern to the scan path via the scan input ("Scan In"). A second scan test circuit (not shown) coupled to the scan output ("Scan Out") may receive the test pattern from the scan output and determine whether the loop-back test is successful. The second scan test circuit may do this, for example, by comparing the received test pattern with the known test pattern. In this example, the second scan test circuit may determine the test is successful if the received test pattern matches the known test pattern. The second scan circuit may then input test data indicating the results of the scan test to one or more of the scan cells on the first die 210 for output to the external tester.

In the example shown in FIG. 4A, the circuit 410 has equal numbers of transmitters and receivers. However, it is to be appreciated that the present disclosure is not limited to this example. For example, if the bandwidth of data transmission from the first die 210 to the second die 250 is greater than the bandwidth of data transmission from the second die 250 to the first die, then the circuit 410 may have a larger number of transmitters than receivers. In general, it is to be appreciated that the numbers of transmitters and receivers may be equal or different. In either case, the circuit 410 may include scan multiplexers that form a scan path in the test mode that passes through the transmitters and receivers for testing.

The first test configuration allows the external tester to perform concurrent die-level testing of the first die 210 and the second die 250, in which the external tester accesses the test circuits of the first and second dies via separate sets of test inputs and outputs. More particularly, the external tester accesses the test circuit 228 of the first die 210 via TDI 222, TCK input 223, TMS input 224, TRST input 225 and TDO 227, and accesses the test circuit of the second die via TDI 251, TCK input 263, TMS input 264, TRST input 265 and TDO 266. Concurrent die-level testing of the dies 210 and 250 substantially reduces test time, thereby reducing costs associated with testing.

In a second test configuration, the multi-die chip 205 may be tested at a chip-level, in which the test circuits 210 and 250 of both dies are engaged. As discussed further below, during test execution, the scan chains 248 and 290 of the first die 210 and the second die 250 are coupled to form a single scan chain for chip-level testing. As used herein, the term "chip-level test" may include a die-to-die test to test interconnections (e.g., interconnections 315) between dies (the first and second dies 210 and 250) on the multi-die chip, and/or a boundary I/O test to test external connections between the multi-die chip 205 and one or more devices external to the multi-die chip 205.

The external tester may enable the second test configuration by inputting a corresponding control signal to the BCE input 226. For example, the second test configuration may be enabled when a second control value (e.g., logic one) is input to the BCE input 226.

In response to the control signal for the second test configuration, the demultiplexer 242 of the first test configuration circuit 245 couples the TDO 241 of the first test circuit 228 to the second TDO 243 of the first die 210.

In response to the control signal for the second test configuration, the first multiplexer 271 and the second multiplexer 272 of the second test configuration circuit 270 couple the third TDI 288 of the second die 250 to the TDI 276 of the second test circuit 286. As a result, the TDO 241 of the first test circuit 228 on the first die 210 is coupled (linked) to the TDI 276 of the second test circuit 286 on the second die 250 via path 294. The third multiplexer 273 of the second test configuration circuit 286 couples the first TCK input 253 to the TCK input 277 of the second test circuit 286. The fourth multiplexer 274 couples the first TMS input 255 to the TMS input 278 of the second test circuit 286. The fifth multiplexer 275 couples the first TRST input 257 to the TRST input 279 of the second test circuit 286.

In the second test configuration, the external tester accesses the test circuits 228 and 286 via TDI 222, TCK input 223, TMS input 224, TRST input 225 and TDO input 226, while TDI 262, TCK input 263, TMS input 264, TRST input 265 and TDO 227 may not be used by the external tester. In this regard, TDI 222, TCK input 223, TMS input 224, TRST input 225 and TDO input 226 may be considered the primary TDI, TCK input, TMS input, TRST input and TDO input, respectively, for chip-level testing while TDI 262, TCK input 263, TMS input 264, TRST input 265 and TDO 227 may be considered secondary TDI, TCK input, TMS input, TRST input and TDO input, respectively, that may not be used by the external tester for chip-level testing.

To perform a test in the second test configuration, the external tester may input TMS signals to primary TMS input 224 to initiate test setup. The TMS signals are received by the TAP controllers 235 and 280 of both dies since the TMS inputs of both test circuits 228 and 286 are coupled to primary TMS input 224 in this configuration. For test setup, the TAP controller 235 on the first die 210 may instruct the demultiplexer 238 to couple the TDI 230 of the first test circuit 228 to the instruction register 237, and instruct the multiplexer 242 to couple the instruction register 237 to the TDO 241 of the first test circuit 228. Also, the TAP controller 280 on the second die 250 may instruct the demultiplexer 284 to couple the TDI 276 of the second test circuit 286 to the instruction register 282, and instruct the multiplexer 283 to couple the instruction register 282 to the TDO 285 of the second test circuit 286. Thus, in this configuration, the instruction registers 237 and 282 of the first and second dies 210 and 250 are linked via path 294, and are coupled between the primary TDI 222 and the primary TDO 266.

The external tester may then load test instructions (also referred to as an instruction vector) into the instruction registers 237 and 282 of the first and second dies 210 and 250 via the primary TDI 222. In this regard, the test instructions (instruction vector) may include a first portion for setting up the second test circuit 286 on the second die 250, and a second portion for setting up the first test circuit 228 on the first die 210. In this example, the first portion of the instructions may pass through the first die and be loaded into the instruction register 282 of the second test circuit 286, and the second portion of the instructions may be loaded into the instruction register 237 of the first test circuit 228.

Programming logic (not shown) on the second die 250 may program the scan cells 290-1 to 290-p and/or other test logic (e.g., internal scan paths) on the second die 250 to implement the test setup specified by the first portion of the instructions in the instruction register 282. Similarly, programming logic (not shown) on the first die 210 may program the scan cells 244-1 to 244-n and/or other test logic (e.g., internal scan paths) on the first die 210 to implement the test setup specified by the second portion of the instructions in the instruction register 237.

The external tester may input a clock signal to the test circuits 228 and 286 via the primary TCK input 223 to time operations of the test circuits 228 and 286. Thus, in this example, the test circuits 228 and 286 share a common clock signal. The test circuits 228 and 286 may use the clock signal to clock the loading of instructions into the instructions registers 237 and 284.

The external tester may then input signals to the TAP controllers 235 and 280 via the primary TMS input 224 to initiate test execution. In response, the TAP controller 230 on the first die 210 may instruct the demultiplexer 238 to couple the TDI 230 of the first test circuit 228 to the scan chain 248, and instruct the multiplexer 240 to couple the scan chain 248 to the TDO 241 of the first test circuit 228. Also, the TAP controller 280 on the second die 250 may instruct the demultiplexer 284 to couple the TDI 276 of the second test circuit 286 to the scan chain 292, and instruct the multiplexer 283 to couple the scan chain 292 to the TDO 285 of the second test circuit 286. As a result, the scan chains 248 and 292 of the first and second test circuits 228 and 286 are linked together via path 294 to form a single scan chain, which is coupled between the primary TDI 222 and the primary TDO 266. Thus, in this configuration, the external tester sees one scan chain. The external tester may serially load test data into the single scan chain via the primary TDI 222, and read out test data from the single scan chain via the primary TDO 266. The shifting of test data in the single scan chain may be clocked using the clock signal from the external tester, which is input via the primary TCK input 223. After testing, the external tester may reset the TAP controllers 235 and 280 by inputting a reset signal to the multi-die chip 205 via the primary TRST input 225.

Figure 5:
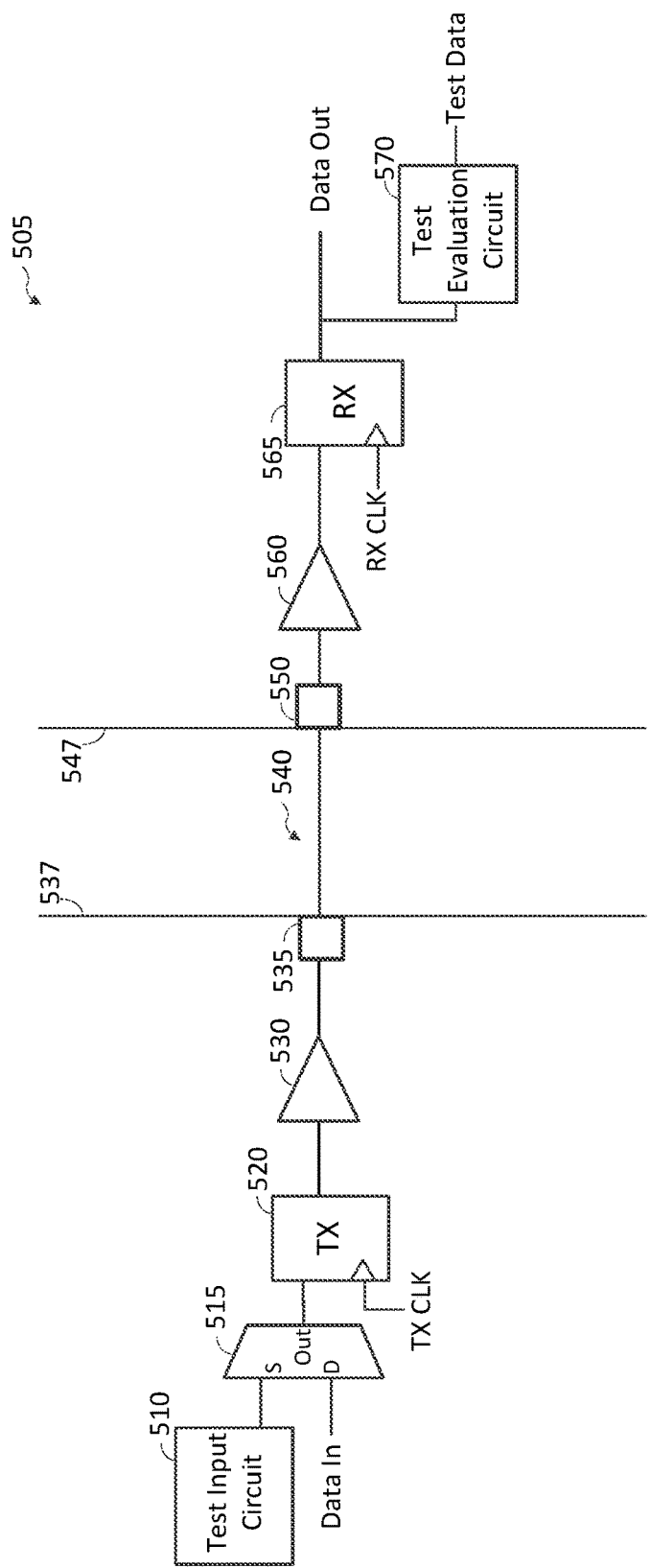
FIG. 5 shows an example of a test structure for performing a die-to-die test according to certain aspects of the present disclosure.

In the second test configuration, the external tester may perform die-to-die testing to test the interconnections (e.g., interconnections 315) between the first die 210 and the second die 250 on the multi-die chip 205. In this regard, FIG. 5 shows an example of a circuit 505 that supports die-to-die testing, according to certain aspects. The circuit 505 is described below in the context of the communication from the first die 210 to the second die 250 for ease of discussion. However, it is to be appreciated that the circuit 505 is also applicable to communication from the second die 250 to the first die 210.

On the first die 210, the circuit 505 includes a test input circuit 510, a multiplexer 515, a transmit latch 520, a transmitter 530 (also referred to as a driver), and a first I/O pad 535. The transmit latch 520 is clocked by a transmit clock signal ("TX CLK"). The I/O pad 535 may correspond to one of the I/O pads in the first set of I/O pads 310 shown in FIG. 3. The I/O pad 535 is coupled to a channel 540. The channel 540 is coupled between the first die 210 and the second die 250, and may correspond to one of the connections 315 shown in FIG. 3. In FIG. 5, the boundary of the first die 210 is represented by line 537.

On the second die 250, the circuit 505 includes a second I/O pad 550, a receiver 560 (e.g., amplifier), a receive latch 565, and a test evaluation circuit 570. The receive latch 565 is clocked by a receive clock signal ("RX CLK"). The I/O pad 550 may correspond to one of the I/O pads in the first set of I/O pads 320 shown in FIG. 3. The I/O pad 550 is coupled to the channel 540. In FIG. 5, the boundary of the second die 250 is represented by line 547.

The circuit 505 is configured to operate in a functional mode or a test mode. In the functional mode, the multiplexer 515 couples a data input to the input of the transmit latch 520. The transmit latch 520 samples the data using the transmit clock signal TX CLK, and the transmitter 530 transmits the sampled data across the channel 540. The receiver 560 receives the data, and the receive latch 565 samples the received data using the receive clock signal RX CLK. The receive latch 565 outputs the sampled data to another component (e.g., processor) on the second die 250 for further processing.

In the test mode, the multiplexer 515 couples the test input circuit 510 to the input of the transmit latch 520. The test input circuit 510 generates a test pattern for transmission across the channel 540. For example, the test input circuit 510 may include a pseudorandom binary sequence (PRBS) generator for generating the test pattern. The test input circuit 510 inputs the generated test pattern to the input of the transmit latch 520. The transmit latch 520 samples the test pattern using the transmit clock signal TX CLK, and the transmitter 530 transmits the sampled test pattern across the channel 540. The receiver 560 receives the test pattern, and the receive latch 565 samples the received test pattern using the receive clock signal RX CLK. The receive latch 565 outputs the sampled test pattern to the test evaluation circuit 570.

The test evaluation circuit 570 then determines whether the test is successful based on the received test pattern. For example, the test evaluation circuit 570 may be configured to generate a test pattern that is identical to the one generated at the test input circuit 510. In one example, the test evaluation circuit 570 may include a PRBS generator that generates the same test pattern as a PRBS generator at the test input circuit 510. The test evaluation circuit 570 may then compare the received pattern with the generated test pattern, and determine whether the test is successful based on the comparison (e.g., determine the test is successful if the received pattern and the generated pattern match). The test evaluation circuit 570 may then input test data indicating the results of the test to one or more of the scan cells on the second die 250. The test data may then be shifted out of the single scan chain for output to the external tester via the primary TDO 266.

In the above example, the instructions for the first die 210 may setup the portion of the die-to-die test performed at the first die 210, and the instructions for the second die 250 may setup the portion of the die-to-die test performed at the second die 250. In this example, the test circuits 228 and 286 of both dies 210 and 250 are engaged.

The circuit 505 shown in FIG. 5 may be duplicated for each one of multiple connections between the first die 210 and the second die 250 to test each one of the multiple connections. Although the circuit 505 is discussed above in the context of the communication from the first die 210 to the second die 250, it is to be appreciated that the circuit 505 may be duplicated to test communication from the second die 250 to the first die 210. In this case, the test input circuit 510, the transmit latch 520, and transmitter 530 are located on the second die 250, and the receiver 560, receive latch 565, and test evaluation circuit 570 are located on the first die 210.

In the second test configuration, the external tester may also perform a boundary I/O test to test the connections between multi-die chip 205 and one or more external devices. For example, the instructions for the first die 210 may include instructions for testing the connections at the second set of I/O pads 330 on the first die 210, and the instructions for the second die 250 may include instructions for testing the connections at the second set of I/O pads 340 on the second die 250. Note that these I/O pads 330 and 340 are coupled to external contacts of the multi-die chip 205, as discussed above. Thus, the boundary I/O test provides a test of the external connections of the multi-die chip 205. As discussed above, the boundary I/O test may include driving one or more scan cells with test data and capturing test data generated in response to the driving. The boundary I/O test may also include receiving test data transmitted from the one or more external devices across the external connections. The test data resulting from the boundary I/O test may be captured by one or more scan cells on the single scan chain (i.e., the linked scan chains 248 and 292), and shifted out of the single scan chain via the primary TDO 266 for output to the external tester.

In a third test configuration, the external tester may read an identification code from the multi-die chip 205 to identify the multi-die chip 205. The external tester may enable the third test configuration by inputting the same control value (e.g., logic one) to the BCE input 226 as used for the second configuration, and, in addition, inputting an IDCODE instruction into the multi-die chip 205, as discussed further below.

In response to the IDCODE instruction, the first and second multiplexers 271 and 272 of the second test configuration circuit 270 couple the second TDI 287 of the second die 250 to the TDI 276 of the second test circuit 286. Thus, in the third configuration, the TDI 276 of the second test circuit 286 is coupled to the primary TDI 222 via the bypass path 296, which bypasses the first die 210.

Accordingly, when the second die 250 executes the IDCODE instruction, the identification code register 281 of the second die 250 is coupled between the primary TDI 222 and the primary TDO 266. As a result, when the external tester performs an identification read, the external tester receives the identification code stored in the identification code register 281 of the second die 250, and uses this identification code to identify the multi-die chip 205. The identification code register 236 on the first die 210 is bypassed, and is therefore not read. Thus, the external tester sees one identification code (i.e., identification code stored in identification code register 281 in this example). The identification code may be used to identify the multi-die chip for a chip-level test.

The test architecture according to embodiments of the present disclosure allow the external tester to test a multi-die chip in various test modes. Examples of the test modes are provided below.

In a first test mode, the reconfigurable test circuit of the multi-die chip 205 is placed in the first test configuration discussed above to enable concurrent die-level testing of the dies 210 and 250. The external tester may place the reconfigurable test circuit in the first test configuration by inputting the first control value (e.g., logic zero) to the BCE input 226. The die-level test for each die may include test setup and test execution. The test execution may include a scan test in which test data is scanned through internal logic on the die to test the functionality of the logic. The test execution may also include a built-in memory test to test embedded memory on the die, as discussed above. In the first test mode, test setup and test execution of the first die 210 may be performed independently from test setup and test execution of the second die 250.

In one example, the die-level test for a die may be the same or similar to a test that is performed on the die before the die is packaged in the multi-die chip. In this example, the die-level test for the die may be performed to determine whether the die still functions properly after packaging.

In a second test mode, the reconfigurable test circuit of the multi-die chip 205 is placed in the second test configuration discussed above. The external tester may place the reconfigurable test circuit in the second test configuration by inputting the second control value (e.g., logic one) to the BCE input 226. In the second test mode, the scan chains 248 and 292 of the first and second dies 210 and 250 are linked to form a single scan chain during test execution. In this mode, an external tester may perform chip-level testing of the multi-die chip 205. The chip-level testing may include die-to-die testing (e.g., to test interconnections between dies on the multi-die chip 205), in which the test circuits 228 and 286 of both dies 210 and 250 are engaged, as discussed above. The chip-level testing may also include I/O boundary testing to test external connections between the multi-die chip 205 and one or more external devices. The multi-die chip 205 and the one or more external devices may be mounted on the same board (e.g., printed circuit board) and the external connections may include traces on the board. The I/O boundary testing may involve sending and/or receiving test data via external I/O contacts 335 and 345 and I/O pads 330 and 340. Test data generated during the chip-level test may be scanned out of the single scan chain to the external tester via primary TDO 266 and/or output to the external tester via external I/O contacts 335 and 345.

In a third test mode, the reconfigurable test circuit of the multi-die chip 205 is placed in the third test configuration discussed above. The external tester may place the reconfigurable test circuit in the third test configuration by inputting the second control value (e.g., logic one) to the BCE input 226 and an IDCODE instruction to the second die 250. In this mode, the external tester may read the identification code stored in the identification code register 281 on the second die 250 to identify the multi-die chip 205 for a chip-level test while bypassing the identification code register 236 on the first die 210. Thus, in the mode, the external tester sees one identification code for the multi-die chip.

Although two dies (labeled "Die1" and "Die2") are shown in FIG. 2 for simplicity, it is to be appreciated that the test architecture according to embodiments of the present disclosure can be scaled up to test any number of dies in a multi-die chip. In general, in the first test configuration, the external tester may test each die concurrently to reduce test time. The external tester may access the test circuit of each die via a separate test interface (e.g., separate set of TDI, TCK input, TMS input, TRST input, and TDO).

In the second test configuration, the scan chains of the dies may be linked together to form a single scan chain, in which the external tester may load test data into the single scan chain via the primary TDI (e.g., primary TDI 222) and receive test data from the single scan chain via the primary TDO (e.g., primary TDO 266). The external tester may control the TAP controllers of the dies via the primary TMS input, and reset the TAP controllers of the dies via the primary TRST input. Also, the external tester may clock the test circuits with a common clock signal via the primary TCK input.

In the third test configuration, the external tester reads the identification code in the identification code register of one of the dies to identify the multi-die chip while the identification code registers of the other dies in the multi-die-chip are bypassed.

Figure 6:
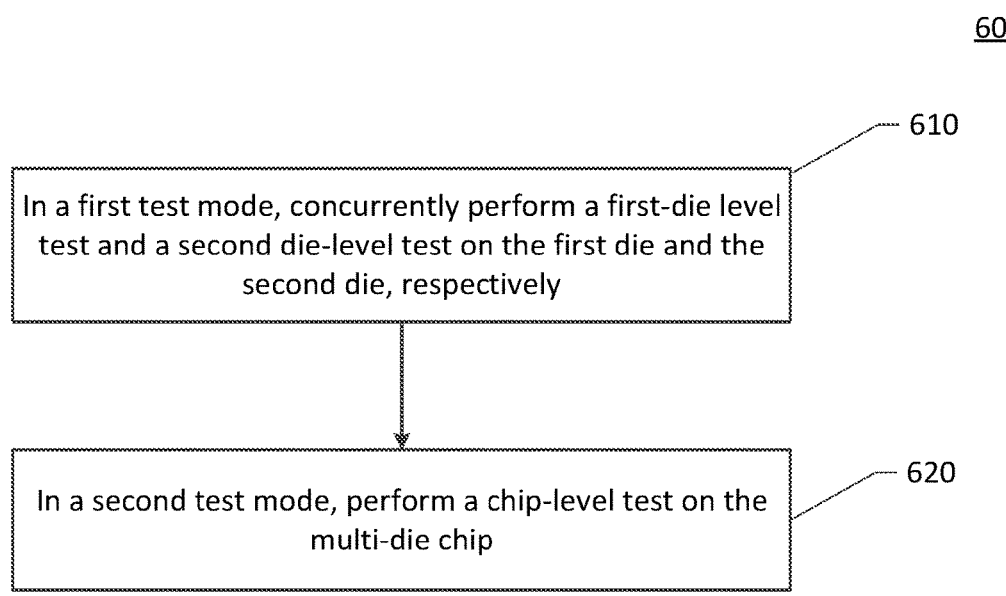
FIG. 6 is a flowchart illustrating a method for testing a multi-die chip according to certain aspects of the present disclosure.

FIG. 6 is a flowchart illustrating an example of a method 600 for testing a multi-die chip, wherein the multi-die chip includes a first die and a second die. The method 600 may be performed, for example, by the reconfigurable test circuit of the multi-die chip 205 and/or the external tester.

At step 610, in a first test mode, a first die-level test and a second die-level test are performed concurrently on the first die and the second die, respectively. For example, the die-level test may be performed on the first die (e.g., first die 210) using an internal test circuit (e.g., first test circuit 228) of the first die, and the second die-level test may be performed on the second die (e.g., second die 250) using an internal test circuit (e.g., second test circuit 286) of the second die.

At step 620, in a second test mode, a chip-level test is performed on the multi-die chip. The chip-level test may include a die-to-die test to test interconnections (e.g., interconnections 315) between the first die and the second die on the multi-die chip. The chip-level test may also include a boundary I/O test to test external connections between multi-die chip and one or more devices external to the multi-die chip.

Figure 7:
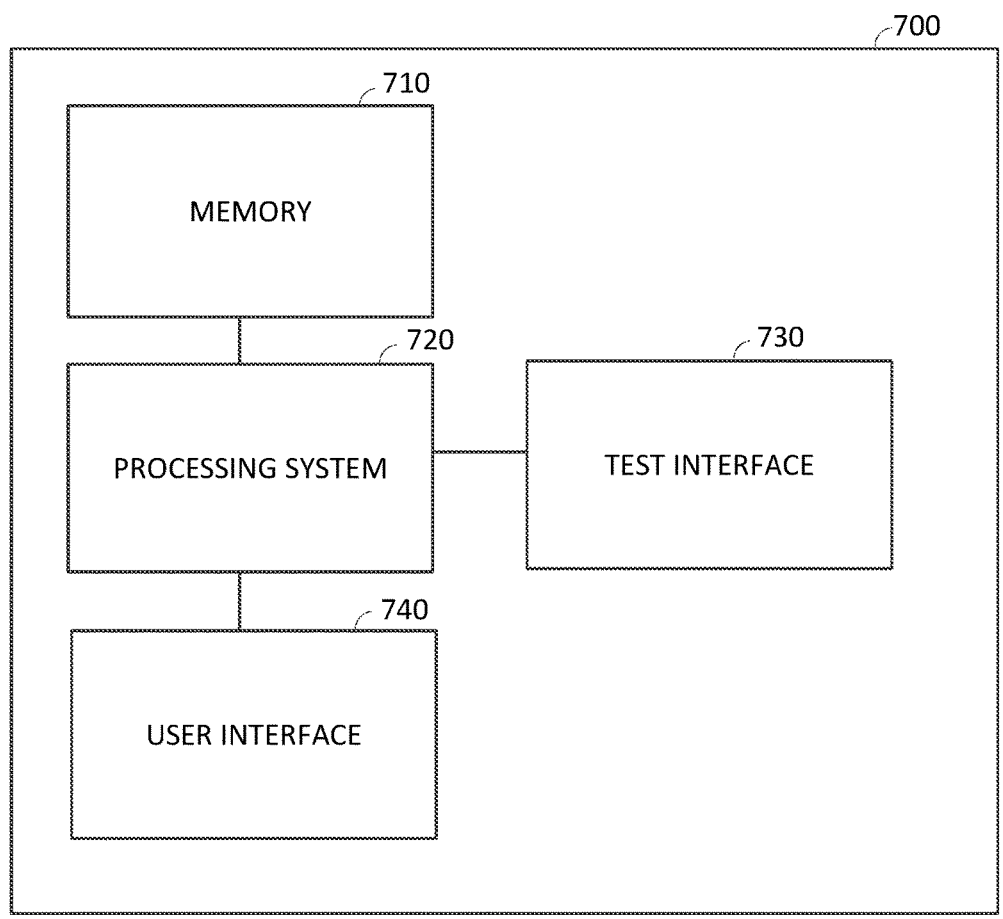
FIG. 7 shows an exemplary tester that may be used in conjunction with embodiments of the present disclosure.

FIG. 7 illustrates an example of an external tester 700 that may be used in conjunction with embodiments of the present disclosure. For example, the tester 700 may interface with the reconfigurable test circuit of the multi-die-chip 205 to initiate any one or more of the tests discussed above and receive the test data generated from the tests. The tester 700 includes a processing system 720, and a memory 710 coupled to the processing system 720. The memory 710 may store instructions that, when executed by the processing system 720, cause the processing system 720 to perform one or more of the operations of the external testers described herein. The processing system 720 may be implemented with a general-purpose processor, a digital signal processor (DSP), an application specific integrated circuit (ASIC), a field programmable gate array (FPGA) or other programmable logic device, discrete hardware components (e.g., logic gates), or any combination thereof designed to perform the functions described herein. The memory 720 may include a computer-readable storage medium, such as a RAM, a ROM, an EEPROM, an optical disk, and/or a magnetic disk.

The tester 700 also includes a test interface 730 that couples to one or more of the TDIs, TDOs, TMS inputs, TCK inputs, TRST inputs, and BCE input of the multi-die chip 205 discussed above. The test interface 730 allows the processing system 720 to input test data to one or more scan chains, receive output test data from one or more scan chains, input one or more TMS signals to one or more of the TAP controllers, input one or more clock signals to one or more test circuits to time operations of the one or more test circuits, input one or more TRST signals to reset one or more TAP controllers, and input one or more BCE signals to control the configuration of one or more test circuits. The test interface 730 may also couple to one or more of the external contacts 335 and 345 of the multi-die chip to input and/or receive test data via the external contracts 335 and 345.

The tester 700 may include a user interface 740 coupled to the processing system 720. The user interface 740 may be configured to receive data and/or commands from a user (e.g., via keypad, mouse, joystick, etc.) and provide the data and/or commands to the processing system 720. The user interface 740 may also be configured to output data (e.g., test results) from the processing system 720 to the user (e.g., via a display, speaker, etc.).

In the present disclosure, concurrent die-level testing of the first die and the second die is intended to mean that the die-level test of the first die and the die-level test of the second die overlap in time such that the die-level test of the first die and the die-level test of the second die are performed simultaneously during the overlap. Although concurrent die-level testing covers the case in which the die-level test of the first die and the die-level test of the second die have approximately the same start time and same end time, it is to be understood that concurrent die-level testing also covers the case in which the die-level test of the first die and the die-level test of the second die overlap in time, but may have different start times and/or different end times. For example, the die-level tests of the first die and the second die may end at different times if one of the die-level tests finishes before the other one of the die-level tests. As discussed above, concurrently die-level testing reduces total test time compared with the case in which the die-level tests of the dies are performed sequentially (i.e., the die-level tests of the dies are performed one at a time).

In the present disclosure, a "scan path" refers to a signal path along which test data can propagate to test the functionality of a circuit. A "scan path" may pass through one or more circuit structures (e.g., logic) to be tested on a die. The "scan path" may include one or more multiplexers configured to enable the "scan path" in the test mode and disable the "scan path" in the functional mode. In this regard, programming logic may enable the "scan path" in the test mode, for example, based on test instructions received in an instruction register (e.g., instruction register 237 or 282). The "scan path" may be coupled to one or more scan cells (e.g., in a boundary scan chain) for receiving and outputting test data and/or coupled to one or more I/O pads for receiving and outputting test data.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two components. The term "circuit" is used broadly, and intended to cover hardware implementations of electrical devices and conductors that, when connected and configured, enable the performance of the functions described in the present disclosure. The term "circuit" is also intended to cover software implementations, in which a processor performs the functions described herein by executing software comprising code for performing the functions. The software may be stored on a computer-readable storage medium, such as a RAM, a ROM, an EEPROM, an optical disk, and/or a magnetic disk.

It is to be understood that present disclosure is not limited to the specific order or hierarchy of steps in the methods disclosed herein. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A multi-die chip, comprising:
   a substrate;
   a first die on the substrate, wherein the first die has a test data input (TDI), a first test data output (TDO), and a second TDO, and wherein the first die comprises:
   a first test circuit having an input and an output, wherein the first test circuit comprises:
   a first scan chain;
   a first instruction register; and
   a first test access controller configured to couple the first instruction register between the input and the output of the first test circuit during setup of a first test, and to couple the first scan chain between the input and output of the first test circuit during execution of the first test; and a first test configuration circuit configured to receive a control signal, to couple the output of the first test circuit to the first TDO of the first die if the control signal has a first control value, and to couple the output of the first test circuit to the second TDO of the first die if the control signal has a second control value; and a second die on the substrate, wherein the second die has a first TDI, a second TDI, and a TDO, and wherein the second TDI of the second die is coupled to the second TDO of the first die, and the second die comprises:

a second test circuit having an input and an output; and a second test configuration circuit configured to receive the control signal, to couple the input of the second test circuit to the first TDI of the second die if the control signal has the first control value, and to couple the input of the second test circuit to the second TDI of the second die if the control signal has the second control value.

2. The multi-die chip of claim 1, wherein the TDI of the first die is coupled to a first external TDI, and the first TDI of the second die is coupled to a second external TDI.

3. The multi-die chip of claim 2, wherein the second die also has a third TDI, the third TDI of the second die is coupled to the first external TDI via a bypass path that bypasses the first die, and the second configuration circuit is further configured to couple the input of the second test circuit to the third TDI in response to the second test circuit executing an identification code instruction if the control signal has the second control value.

4. The multi-die chip of claim 1, wherein the second test circuit comprises:

a second scan chain;
a second instruction register; and
a second test access controller configured to couple the second instruction register between the input and the output of the second test circuit during setup of a second test, and to couple the first scan chain between the input and output of the second test circuit during execution of the second test.

5. A die having a test data input (TDI), a first test data output (TDO), and a second TDO, the die comprising:

a test circuit having an input and an output, wherein the test circuit includes:

a scan chain;
an instruction register; and
a test access controller configured to couple the instruction register between the input and the output of the test circuit during setup of a test, and to couple the scan chain between the input and output of the test circuit during execution of the test; and a test configuration circuit configured to receive a control signal, to couple the output of the test circuit to the first TDO if the control signal has a first control value, and to couple the output of the test circuit to the second TDO if the control signal has a second control value.

6. The die of claim 5, wherein the input of the test circuit is coupled to the TDI.

7. The die of claim 5, wherein the second TDO is coupled to a TDI of another die.

8. A die having a first test data input (TDI), a second TDI, and a test data output (TDO), the die comprising:

a test circuit having an input and an output, wherein the test circuit includes:

a scan chain;
an instruction register; and
a test access controller configured to couple the instruction register between the input and the output of the test circuit during setup of a test, and to couple the scan chain between the input and output of the test circuit during execution of the test; and a test configuration circuit configured to receive a control signal, to couple the input of the test circuit to the first TDI if the control signal has a first control value, and to couple the input of the test circuit to the second TDI if the control signal has a second control value.

9. The die of claim 8, wherein the output of the test circuit is coupled to the TDO.

10. The die of claim 8, wherein the second TDI is coupled to a TDO of another die.

11. The die of claim 8, wherein the die also has a third TDI, and the test configuration circuit is further configured to couple the input of the test circuit to the third TDI in response to the test circuit executing an identification code instruction if the control signal has the second control value.

* * * * *